United States Patent
Lee et al.

(10) Patent No.: US 11,573,086 B2
(45) Date of Patent: Feb. 7, 2023

(54) ELECTRONIC APPARATUS OF ESTIMATION OF MOVEMENT DIRECTION AND METHOD THEREOF

(71) Applicants: Samsung Electronics Co., Ltd., Suwon-si (KR); Seoul National University R&DB Foundation, Seoul (KR)

(72) Inventors: Yonggwon Lee, Suwon-si (KR); Taekyoung Kwon, Seoul (KR); Minhyeok Kang, Seoul (KR); Myeongcheol Kwak, Seoul (KR); Taeheon Park, Seoul (KR)

(73) Assignees: Samsung Electronics Co., Ltd., Suwon-si (KR); Seoul National University R&DB Foundation, Seoul (KR)

(*) Notice: Subject to any disclaimer, the term of this patent is extended or adjusted under 35 U.S.C. 154(b) by 418 days.

(21) Appl. No.: 16/526,302

(22) Filed: Jul. 30, 2019

(65) Prior Publication Data
US 2020/0232796 A1     Jul. 23, 2020

(30) Foreign Application Priority Data

Jan. 23, 2019 (KR) .................. 10-2019-0008843

(51) Int. Cl.
*G01C 21/18* (2006.01)
*G01C 25/00* (2006.01)
(Continued)

(52) U.S. Cl.
CPC .......... *G01C 21/18* (2013.01); *G01C 25/005* (2013.01); *G01P 15/18* (2013.01); *G01R 33/02* (2013.01)

(58) Field of Classification Search
CPC .... G01C 21/18; G01C 25/005; G01C 21/165; G01C 21/16; G01C 22/00; G01P 15/18; G01R 33/02; G01D 21/02
(Continued)

(56) References Cited

U.S. PATENT DOCUMENTS

2013/0345972 A1* 12/2013 Askarpour ............. G01C 19/36
                                                           33/356
2015/0308831 A1   10/2015 Lee et al.
(Continued)

FOREIGN PATENT DOCUMENTS

JP      2015169636 A  *  9/2015
JP      2017-059891 A    3/2017
(Continued)

OTHER PUBLICATIONS

English translation for JP-2015169636-A (Year: 2015).*
(Continued)

*Primary Examiner* — Lee E Rodak
*Assistant Examiner* — Byung Ro Lee
(74) *Attorney, Agent, or Firm* — Jefferson IP Law, LLP

(57) ABSTRACT

An electronic apparatus is provided. The electronic apparatus includes an acceleration sensor, a gyro sensor, a geomagnetic sensor, and a processor configured to compare geomagnetic data of the geomagnetic sensor and gyro data of the gyro sensor and correct the gyro data, determine a first value based on a principal component analysis (PCA) of acceleration data of the acceleration sensor, and determine a second value based on a PCA of the gyro data, and estimate a moving direction of the electronic apparatus based on the first value and the second value.

13 Claims, 16 Drawing Sheets

(51) Int. Cl.
*G01R 33/02* (2006.01)
*G01P 15/18* (2013.01)

(58) Field of Classification Search
USPC ........................................................ 73/504.3
See application file for complete search history.

(56) References Cited

U.S. PATENT DOCUMENTS

| | | | |
|---|---|---|---|
| 2016/0334514 A1* | 11/2016 | Manabe | G01S 19/39 |
| 2017/0023604 A1* | 1/2017 | Kourogi | G01P 13/00 |
| 2017/0153110 A1* | 6/2017 | Matsushita | G01C 21/165 |
| 2017/0258407 A1* | 9/2017 | Shirai | A61B 5/01 |
| 2018/0249341 A1* | 8/2018 | Park | H04W 24/10 |

FOREIGN PATENT DOCUMENTS

| | | |
|---|---|---|
| KR | 10-2013-0094407 A | 8/2013 |
| KR | 10-1473653 B1 | 12/2014 |
| KR | 10-1518114 B1 | 4/2015 |
| KR | 10-1531182 B1 | 6/2015 |
| KR | 10-2015-0108402 A | 9/2015 |
| KR | 10-1808095 B1 | 12/2017 |
| WO | 2014/110672 A1 | 7/2014 |

OTHER PUBLICATIONS

Renaudin, Valérie, and Christophe Combettes. "Magnetic, acceleration fields and gyroscope quaternion (MAGYQ)-based attitude estimation with smartphone sensors for indoor pedestrian navigation." Sensors 14.12 (2014): 22864-22890.

Campolo, D., et al. "A novel procedure for in-field calibration of sourceless inertial/magnetic orientation tracking wearable devices." The First IEEE/RAS-EMBS International Conference on Biomedical Robotics and Biomechatronics, Feb. 2006.

Kwak, Myeongcheol, et al., "Leveraging Gyroscopes for Estimating Heading Directions of Smartphone Users", Department of Computer Science and Engineering, 2018 International Conference on Indoor Positioning and Indoor Navigation (IPIN), Nantes, France, Sep. 24-27, 2018.

* cited by examiner

FIG. 5B

| KIND OF EXPERIMENT | ACTUAL NUMBER OF WALKS | MEASURED NUMBER OF WALKS | ERROR RATE |
|---|---|---|---|
| WALKING WHILE CARRYING IN STATIC POSTURE | 60 | 60 | 0% |
| WALKING WHILE SWINGING | 60 | 58 | 3.3% |
| WHILE WALKING IN POCKET | 60 | 58 | 3.3% |

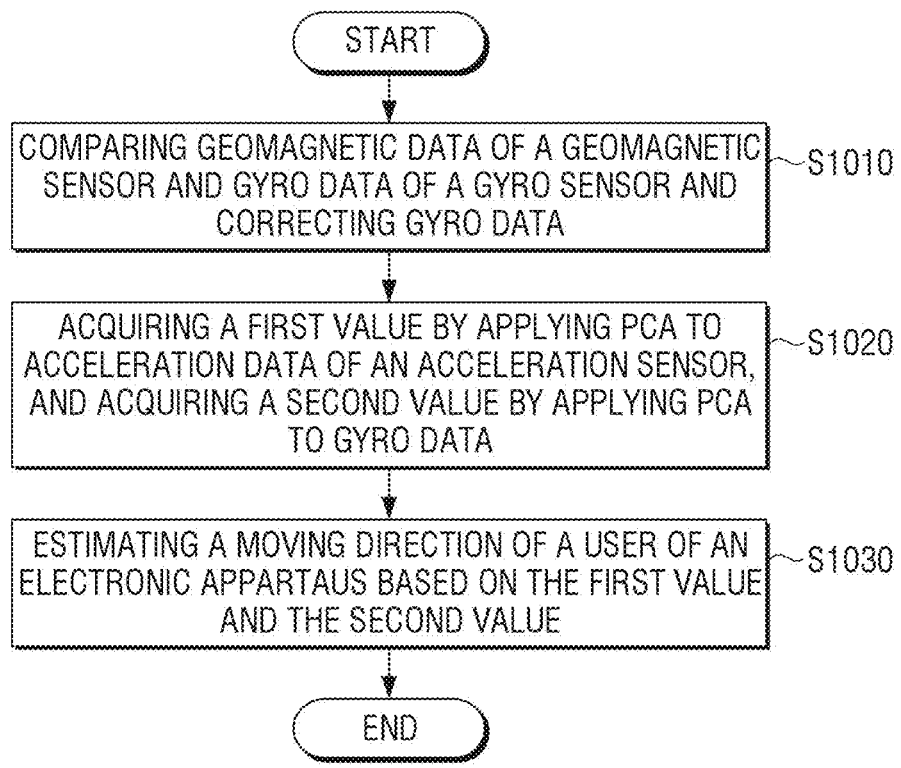

ELECTRONIC APPARATUS OF ESTIMATION OF MOVEMENT DIRECTION AND METHOD THEREOF

CROSS-REFERENCE TO RELATED APPLICATION(S)

This application is based on and claims priority under 35 U.S.C. § 119(a) of a Korean patent application number 10-2019-0008843, filed on Jan. 23, 2019, in the Korean Intellectual Property Office, the disclosure of which is incorporated by reference herein in its entirety.

JOINT RESEARCH AGREEMENT

The disclosure was made by or on behalf of the below listed parties to a joint research agreement. The joint research agreement was in effect on or before the date the disclosure was made and the disclosure was made as a result of activities undertaken within the scope of the joint research agreement. The parties to the joint research agreement are 1) Samsung Electronics Co., Ltd. and 2) Seoul National University R&DB Foundation.

BACKGROUND

1. Field

The disclosure relates to an electronic apparatus and a control method. More particularly, the disclosure relates to an electronic apparatus which includes an inertia sensor and a control method thereof.

2. Description of Related Art

As there is an increasing need for location-based services (LBSs), pedestrian dead reckoning (PDR) is being researched widely as one of core technologies of indoor localization. Most smartphones are equipped with inertia sensors like a magnetic sensor, an accelerometer, a gyroscope, etc. Such inertia sensors are being used widely in a PDR system as they are capable of explicitly tracking walking motions of a user.

A PDR system generally consists of two main components, i.e., step detection and direction estimation. However, there is a problem that, while step detection is relatively precise and stable, a technology of estimating heading direction generates substantial errors.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address the above-mentioned problems and/or disadvantages and to provide at least the advantages described below. Accordingly, an aspect of the disclosure is aimed at providing an electronic apparatus that estimates a heading direction of a user by using an inertia sensor and a principal component analysis (PCA) technic, and a control method thereof.

Additional aspects will be set forth in part in the description which follows and, in part, will be apparent from the description, or may be learned by practice of the presented embodiments.

In accordance with an aspect of the disclosure, an electronic apparatus for achieving the aforementioned purpose is provided. The electronic apparatus includes an acceleration sensor, a gyro sensor, a geomagnetic sensor, and a processor configured to compare geomagnetic data of the geomagnetic sensor and gyro data of the gyro sensor and correct the gyro data, obtain a first value by applying PCA to acceleration data of the acceleration sensor, and obtain a second value by applying PCA to the gyro data, and estimate a moving direction of a user of the electronic apparatus based on the first value and the second value.

Also, the processor may, if a difference between the geomagnetic data and the gyro data is smaller than a threshold, correct the gyro data based on the geomagnetic data.

In addition, the processor may obtain the first value and the second value in predetermined section units, and estimate a moving direction of a user of the electronic apparatus based on an average value of the first value and the second value in each section.

Further, the processor may, if a difference between the first value and the second value exceeds a predetermined range in a specific section, estimate a moving direction of a user of the electronic apparatus by using an average value obtained in the previous section.

Meanwhile, the section units are units including at least a single step, and the processor may identify the step based on a Z axis value obtained from the acceleration sensor.

Also, the processor may convert an acceleration vector obtained from the acceleration sensor to an acceleration vector on a global coordinate, and convert a gyroscope vector obtained from the gyro sensor to a gyroscope vector on a global coordinate, and obtain the first value and the second value by applying the PCA to each of the converted acceleration vector on a global coordinate and the converted gyroscope vector on a global coordinate.

In addition, the processor may calculate a rotation matrix based on a geomagnetic vector obtained from the geomagnetic sensor, an acceleration vector obtained from the acceleration sensor, and a gyroscope vector, and convert the acceleration vector and the gyroscope vector to the acceleration vector on a global coordinate and the gyroscope vector on a global coordinate based on the calculated rotation matrix.

Further, the processor may identify a current posture of the electronic apparatus based on the geomagnetic data and the acceleration data, and calculate the rotation matrix based on the current posture.

Also, the processor may identify the reliability of the current posture of the electronic apparatus based on whether a Euclidean distance between a yaw pattern obtained based on the geomagnetic data and the acceleration data and a yaw pattern obtained based on the gyro data is smaller than a threshold.

In accordance with another aspect of the disclosure, a control method of an electronic apparatus is provided. The control method includes the steps of comparing geomagnetic data of a geomagnetic sensor and gyro data of a gyro sensor and correcting the gyro data, obtaining a first value by applying PCA to acceleration data of an acceleration sensor, and obtaining a second value by applying PCA to the gyro data, and estimating a moving direction of a user of the electronic apparatus based on the first value and the second value.

Also, in the step of correcting the gyro data, if a difference between the geomagnetic data and the gyro data is smaller than a threshold, the gyro data may be corrected based on the geomagnetic data.

In addition, in the step of estimating a moving direction of a user, the first value and the second value may be obtained in predetermined section units, and a moving direction of a user of the electronic apparatus may be estimated based on an average value of the first value and the second value in each section.

Further, in the step of estimating a moving direction of a user, if a difference between the first value and the second value exceeds a predetermined range in a specific section, a moving direction of a user of the electronic apparatus may be estimated by using an average value obtained in the previous section.

Meanwhile, the section units are units including at least one step, and in the step of estimating a moving direction of a user, the step may be identified based on a Z axis value obtained from the acceleration sensor.

Also, in the step of obtaining a first value and a second value, an acceleration vector obtained from the acceleration sensor may be converted to an acceleration vector on a global coordinate, and a gyroscope vector obtained from the gyro sensor may be converted to a gyroscope vector on a global coordinate, and the first value and the second value may be obtained by applying the PCA to each of the converted acceleration vector on a global coordinate and the converted gyroscope vector on a global coordinate.

In addition, in the step of obtaining a first value and a second value, a rotation matrix may be calculated based on a geomagnetic vector obtained from the geomagnetic sensor, an acceleration vector obtained from the acceleration sensor, and a gyroscope vector, and the acceleration vector and the gyroscope vector may be converted to the acceleration vector on a global coordinate and the gyroscope vector on a global coordinate based on the calculated rotation matrix.

Further, in the step of obtaining a first value and a second value, a current posture of the electronic apparatus may be identified based on the geomagnetic data and the acceleration data, and the rotation matrix may be calculated based on the current posture.

Also, in the step of obtaining a first value and a second value, the reliability of the current posture of the electronic apparatus may be identified based on whether an Euclidean distance between a yaw pattern obtained based on the geomagnetic data and the acceleration data and a yaw pattern obtained based on the gyro data is smaller than a threshold.

In accordance with another aspect of the disclosure, a non-transitory computer-readable medium storing computer instructions for making an electronic apparatus according to an embodiment of the disclosure perform operations in case the instructions are executed by the processor of the electronic apparatus is provided. The operations includes the steps of comparing geomagnetic data of a geomagnetic sensor and gyro data of a gyro sensor and correcting the gyro data, obtaining a first value by applying PCA to acceleration data of an acceleration sensor, and obtaining a second value by applying PCA to the gyro data, and estimating a moving direction of a user of the electronic apparatus based on the first value and the second value.

According to various embodiments of the disclosure as described above, errors that may occur in estimating a heading direction of a user can be reduced as much as possible.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 5B is a diagram for illustrating accuracy of a result of step detection according to an embodiment of the disclosure;

FIG. 10 is a flow chart for illustrating a control method of an electronic apparatus according to an embodiment of the disclosure.

Throughout the drawings, like reference numerals will be understood to refer to like parts, components, and structures.

DETAILED DESCRIPTION

Figure 1:
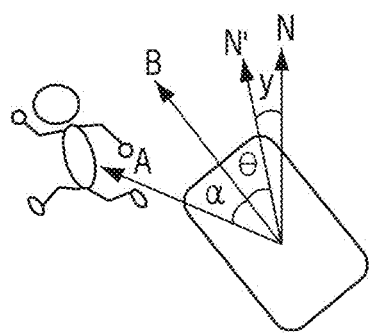
FIG. 1 is a diagram for illustrating a method of estimating a moving direction of a user for promoting understanding of the disclosure according to various embodiments of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

First, terms used in this specification will be described briefly, and then the disclosure will be described in detail.

As terms used in the embodiments of the disclosure, general terms that are widely used currently were selected as much as possible, in consideration of the functions described in the disclosure. However, the terms may vary depending on the intention of those skilled in the art who work in the pertinent field, previous court decisions or emergence of new technologies. Also, in particular cases, there may be terms that were designated by the applicant on his own, and in such cases, the meaning of the terms will be described in detail in the relevant descriptions in the disclosure. Thus, the terms used in the disclosure should be defined based on the meaning of the terms and the overall content of the disclosure, but not just based on the names of the terms.

Further, various modifications may be made to the embodiments of the disclosure, and there may be various types of embodiments. Accordingly, specific embodiments will be illustrated in drawings, and the embodiments will be described in detail in the detailed description. However, it should be noted that the various embodiments are not for limiting the scope of the disclosure to a specific embodiment, but they should be interpreted to include all modifications, equivalents or alternatives of the embodiments included in the ideas and the technical scopes disclosed herein. Meanwhile, in case it is determined that in describing embodiments, detailed explanation of related known technologies may unnecessarily confuse the gist of the disclosure, the detailed explanation will be omitted.

In addition, the expressions "first," "second" and the like used in the disclosure may be used to describe various elements, but the expressions are not intended to limit the elements. Such expressions are used only to distinguish one element from another element.

Meanwhile, singular expressions also include the plural meaning as long as they do not differently mean in the context. In addition, in this specification, terms such as "include" and "consist of" should be construed as designating that there are such characteristics, numbers, operations, elements, components or a combination thereof in the specification, but not to exclude the existence or possibility of adding one or more of other characteristics, numbers, operations, elements, components or a combination thereof.

Also, the expression "at least one of A and B" should be interpreted to mean any one of "A" or "B" or "A and B."

Further, the terms "a module" or "a part" used in the disclosure are for referring to elements performing at least one function or operation, and these elements may be implemented as hardware or software, or as a combination of hardware and software. Further, a plurality of "modules" or "parts" may be integrated into at least one module and implemented as at least one processor (not shown), except "modules" or "parts" that need to be implemented as specific hardware.

FIG. 1 is a diagram for illustrating a method of estimating a moving direction of a user for promoting understanding of the disclosure.

Referring to FIG. 1, a state wherein a user 10 possessing an electronic apparatus 100, e.g., a smartphone is moving in an "A" direction, and the electronic apparatus 100 is moving in a "B" direction is assumed. That is, a user possesses the electronic apparatus 100 in a random location, and thus the local direction of the electronic apparatus 100 and the heading direction of the user may be different.

In this case, the direction B in which the electronic apparatus 100 moves may be acquired by a magnetic sensor like a compass, and the direction A in which the user moves may be calculated by adding a directional error a value according to the form of possession (or the form of carriage) to the direction B in which the electronic apparatus 100 moves. Meanwhile, a magnetic sensor like a compass may output data with an error due to a deviated magnetic field in an indoor space. In this case, an error as much as γ may occur, as illustrated in FIG. 1.

Meanwhile, according to an embodiment of the disclosure, a principal component analysis (PCA) technic may be applied to pedestrian dead reckoning (PDR). That is, a method of correcting a directional error a according to the form of possession by predicting swinging in a to-and-fro direction (an accelerometer) or rotation axes of arms and legs (a gyroscope) that occur during walking by means of PCA may be provided. PCA is a technic of reducing high-dimensional data to low-dimensional data. By the technic, an axis of which dispersion becomes the biggest when data is mapped to a random vector becomes the direction of the first principal component vector, and an axis which is orthogonal thereto and has the second biggest dispersion becomes the direction of the second principal component vector.

When PCA is applied, an axis of which dispersion becomes the largest on an X-Y plane of a global coordinate system (GCS) becomes the direction of the first principal component vector. Accordingly, if PCA is applied to an accelerometer, a direction which is in parallel to the walking direction of a pedestrian (a to-and-fro direction) may become the first principal component vector.

Figure 2A:
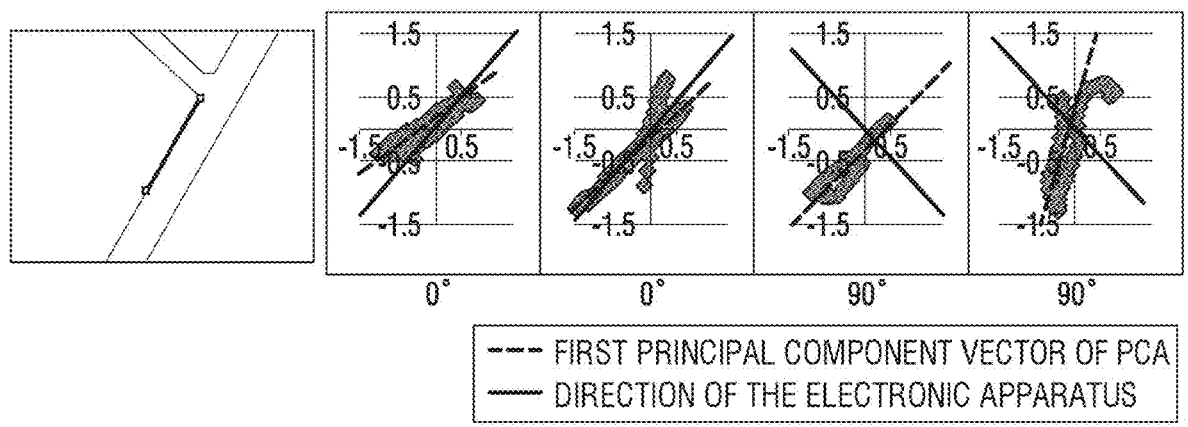
FIG. 2A illustrates data distribution when accelerometer data is converted to a global coordinate according to various embodiments of the disclosure.

FIG. 2A illustrates data distribution when accelerometer data is converted to a global coordinate according to various embodiments of the disclosure.

Figure 2B:
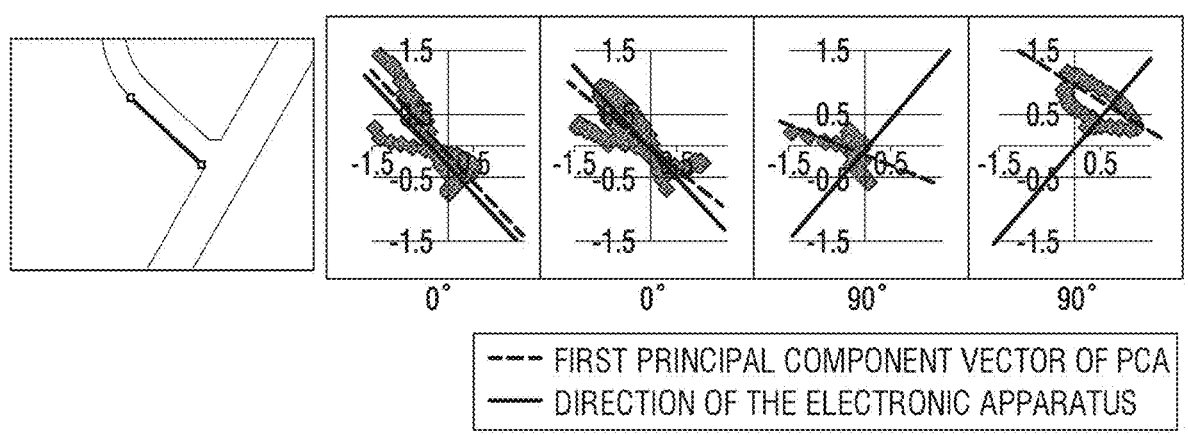
FIG. 2B illustrates data distribution when accelerometer data is converted to a global coordinate according to various embodiments of the disclosure.

FIG. 2B illustrates data distribution when accelerometer data is converted to a global coordinate according to various embodiments of the disclosure.

Referring to FIGS. 2A and 2B illustrate data distribution when accelerometer data collected while walking in a straight direction is converted to a global coordinate. In the drawings, it can be figured out that, even if a difference between the direction of the electronic apparatus 100 and the moving direction of the user varies according to the form of possession, accelerometer data rotated to a global coordinate is dispersed in a direction similar to the moving direction.

Figure 3A:
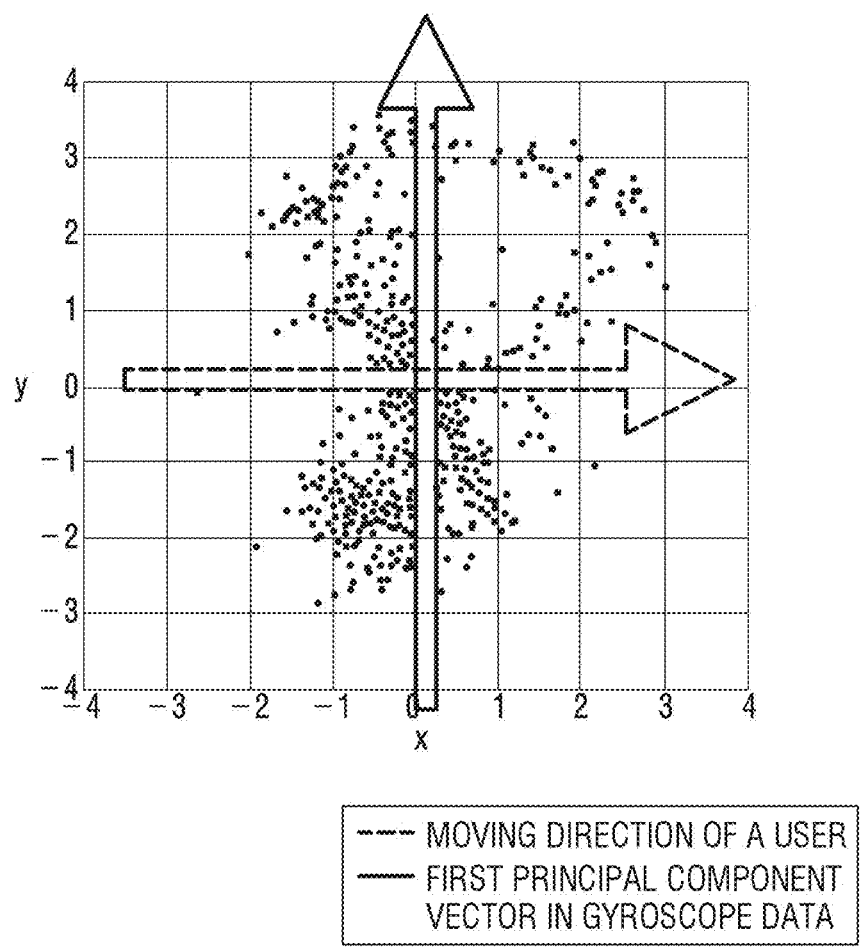
FIG. 3A illustrates data distribution when gyroscope data is converted to a global coordinate according to various embodiments of the disclosure.

FIG. 3A illustrates data distribution when gyroscope data is converted to a global coordinate according to various embodiments of the disclosure.

Also, in case a pedestrian possesses a smartphone in his or her trouser pocket or hand, if PCA is applied to a gyroscope, a direction that is orthogonal to the walking direction of the pedestrian (a rotation axis of arms or legs) may become the first principal component vector, as illustrated in FIG. 3A.

In particular, when angular velocity is changed during walking, in a direction from PCA analysis of gyroscope data, holding positions have high correlation to rotation axes of human arms and legs, especially in a swing case or a pocket case. Thus, the direction is similar to a ground truth direction.

Figure 3B:
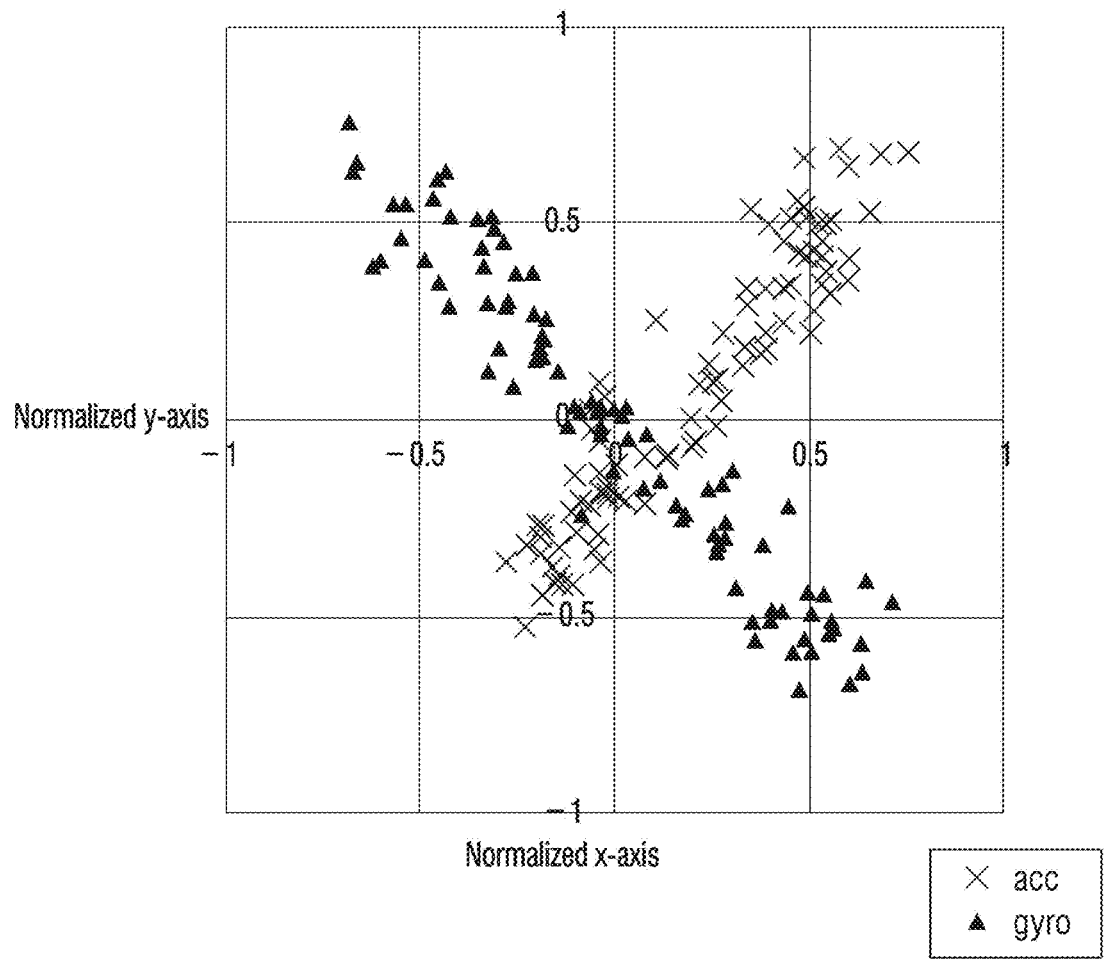
FIG. 3B illustrates data distribution when acceleration data and gyroscope data are converted to global coordinates according to various embodiments of the disclosure.

FIG. 3B illustrates acceleration data and gyroscope data on a X-Y plane of a GCS in case a user walks along a straight route in a northeast direction in a swing case. In the drawing, it can be figured out that acceleration data shows a clear straight line pattern in a northeast direction. Meanwhile, gyroscope data is expressed in an orthogonal direction compared to acceleration data and the ground truth direction. This is because a rotation axis of a user's arm is aligned with the user's shoulder which constitutes a right angle with the user's direction.

In the various embodiments that will be described below, a method of estimating a user's moving direction A in consideration of an error α according to the form of possession of the electronic apparatus 100 and an error γ due to geomagnetic deviation will be described, based on the aforementioned sensor characteristics.

Figure 4:
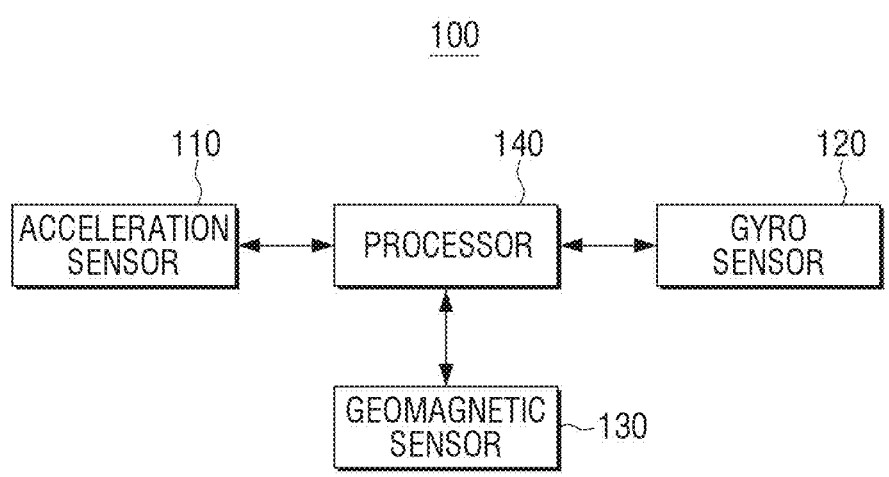
FIG. 4 is a block diagram illustrating a configuration of an electronic apparatus according to an embodiment of the disclosure.

FIG. 4 is a block diagram illustrating a configuration of an electronic apparatus according to an embodiment of the disclosure.

Referring to FIG. 4, the electronic apparatus 100 includes an acceleration sensor 110, a gyro sensor 120, a geomagnetic sensor 130, and a processor 140.

The electronic apparatus 100 may be implemented as an apparatus that can be possessed by a user, such as a smartphone, a tablet personal computer (PC), a mobile phone, a video phone, a personal digital assistant (PDA), a portable multimedia player (PMP), an moving picture experts group phase 1 or phase 2 (MPEG-1 or MPEG-2) audio layer 3 (MP3) player, a medical instrument, a camera, a camcorder, or a wearable device. A wearable device may include at least one of an accessory-type device (e.g., a watch, a ring, a bracelet, an ankle bracelet, a necklace, glasses, a contact lens, or a head-mounted-device (HMD)), a device integrated with fabrics or clothing (e.g., electronic clothing), a body-attached device (e.g., a skin pad or a tattoo), or an implantable circuit.

The acceleration sensor 110 is a sensor that measures the acceleration of the electronic apparatus 100 or the strength of impact on the electronic apparatus 100, and it may also be referred to as an accelerometer. The acceleration sensor detects dynamic force such as acceleration, vibration, impact, etc., and according to the method of detection, it may be implemented as an inertia type, a gyro type, a silicon semiconductor type, and the like.

The gyro sensor 120 is a sensor that measures a change in a direction of an object by using a property of always maintaining a specific direction that was initially set with high accuracy regardless of the Earth's rotation, and it may also be referred to as a gyroscope. The gyro sensor 120 may be implemented in a mechanical type or an optical type using light. Also, the gyro sensor 120 measures angular velocity. Angular velocity refers to an angle at which an object rotates per time, and the principle of measurement of the gyro sensor 120 is as follows. For example, in a parallel state (a pause state), angular velocity is also 0°/sec. However, if an object is tilted as much as 50° while it moves for 10 seconds, the average angular velocity for 10 seconds is 5°/sec. Meanwhile, if the object maintains a tilt angle 50° in a pause state, the angular velocity becomes 0°/sec.

Through a process as above, the angular velocity changes from 0→5→0, and the angle increases from 0° to 50°. In order to calculate an angle from angular velocity, integral should be performed with respect to the entire time. As the gyro sensor measures angular velocity as described above, if the angular velocity is integrated during the entire time, a tilt angle can be calculated.

Meanwhile, in the gyro sensor 120, errors occur due to the influence of the temperature, and as errors are accumulated in the process of integration, a phenomenon wherein a final value is drifted occurs. Accordingly, errors may be compensated by using a temperature sensor together.

The geomagnetic sensor 130 is a sensor used for detecting geomagnetism, and the simplest geomagnetic sensor is a magnetic needle, and it is capable of figuring out a direction of geomagnetism by itself, and also, figuring out a size from a vibration cycle. Other than a magnetic needle, the geomagnetic sensor 130 may be implemented as a magnetometer using rotating coils, a core-saturated (fluxgate) magnetometer using a magnetic saturation phenomenon of a ferromagnetic body, a quantum magnetometer using nuclear magnetic resonance of protons, an optical pumping magnetometer using an alignment effect of rubidium or cesium atoms, a superconducting quantum interference device (SQUID) using a superconductivity phenomenon, etc.

The processor 140 controls the overall operations of the electronic apparatus 100. The processor 140 may be implemented as a digital signal processor (DSP) processing digital signals, a microprocessor, and a time controller (TCON). However, the disclosure is not limited thereto, and the processor 140 may include one or more of a central processing unit (CPU), a micro controller unit (MCU), a micro processing unit (MPU), a controller, an application processor (AP), a graphics-processing unit (GPU) or a communication processor (CP), and an advanced reduced instruction set (RISC) machines (ARM) processor, or may be defined by the terms. Also, the processor 140 may be implemented as a system on chip (SoC) having a processing algorithm stored therein or large scale integration (LSI), or in the form of a field programmable gate array (FPGA). The processor 140 may perform various functions by executing computer executable instructions stored in the memory (not shown).

The processor 140 may compare gyro data of the gyro sensor 120 and geomagnetic data of the geomagnetic sensor 130, and correct the gyro data based on the result of comparison. This is because the gyro sensor 120 can track only a relative change in the posture in the previous state, and thus it may be necessary to correct the gyro data periodically as absolute data of the geomagnetic sensor 130. However, the data of the geomagnetic sensor 130 may be influenced by a deviated magnetic field. Accordingly, in case a difference between geomagnetic data and gyro data is smaller than a threshold, the gyro data may be corrected based on the geomagnetic data.

According to an embodiment of the disclosure, the processor 140 may compare a difference between a rotation angle according to the rotation state of each of x, y, and z axes based on gyro data and a rotation angle according to the rotation state of each of x, y, and z axes based on geomagnetic data as an Euclidean distance, and thereby identify a time point of deviation of geomagnetic data. Then, the processor 140 may correct the gyro data based on the geomagnetic data of a time point wherein the geomagnetic data is not deviated.

Further, the processor 140 may acquire(or determine) a first value by applying PCA to acceleration data of the acceleration sensor 110, and acquire(or determine) a second value by applying PCA to the gyro data.

To be specific, the processor 140 may convert an acceleration vector acquired from the acceleration sensor 110 to an acceleration vector on a global coordinate, and convert a gyroscope vector acquired from the gyro sensor 120 to a gyroscope vector on a global coordinate, and acquire a first value and a second value by applying the PCA to each of the converted acceleration vector on a global coordinate and the converted gyroscope vector on a global coordinate.

In this case, the processor 140 may calculate a rotation matrix based on a geomagnetic vector acquired from the geomagnetic sensor 130, an acceleration vector acquired from the acceleration sensor 110, and a gyroscope vector acquired from the gyro sensor 120, and convert the acceleration vector and the gyroscope vector to an acceleration vector on a global coordinate and a gyroscope vector on a global coordinate based on the calculated rotation matrix.

Here, the processor 140 may identify a current posture of the electronic apparatus 100 based on the geomagnetic data and the acceleration data, and calculate the rotation matrix based on the current posture. Also, the processor 140 may identify the reliability of the current posture of the electronic apparatus 100 based on whether an Euclidean distance between a yaw pattern acquired based on the geomagnetic data and the acceleration data and a yaw pattern acquired based on the gyro data is smaller than a threshold.

Then, the processor 140 may estimate a moving direction (or a heading direction) of a user of the electronic apparatus 100 based on the first value and the second value. To be specific, the processor 140 may acquire a first value and a second value in predetermined section units, and estimate a moving direction of the user based on an average value of the first value and the second value in each section. Meanwhile, the acceleration sensor 110 and the gyro sensor 120 separately estimate a moving direction of the user by respectively detecting acceleration in a to-and-fro direction and rotation of arms and legs independently. This is because the states of errors generated may differ, even if the sensors separately estimate the actual moving direction of the user. Accordingly, in the disclosure, a moving direction of a user may be estimated basically by using an average value of PCA values based on the two sensors.

Also, in case a difference between a first value acquired by the acceleration sensor 110 and a second value acquired by the gyro sensor 120 exceeds a predetermined range in a specific section, the processor 140 may estimate a moving direction of a user by using an average value acquired in the previous section. This is for filtering a situation wherein one of the result values of the two sensors becomes unstable.

Here, the predetermined section units may be units including at least a single step, for example, time units including two steps. This is because the directions of acceleration/rotation generated due to a movement of a user may vary for each step. That is, for alleviating deflection that may occur when a user sets a left foot and a right foot, PCA may be applied to a sensor value acquired in a unit of steps in an even number.

In this case, the processor 140 may identify a step based on a Z axis value acquired from the acceleration sensor 110. For example, the processor 140 may rotate acceleration data acquired from the acceleration sensor 110 to a global coordinate, and then apply auto correlation to acceleration on a Z axis, and thereby identify steps whenever periodicity becomes high. Here, auto correlation refers to a correlation coefficient between data of the present time point and data of the past time point, and data having higher periodicity shows a higher value.

Figure 5A:
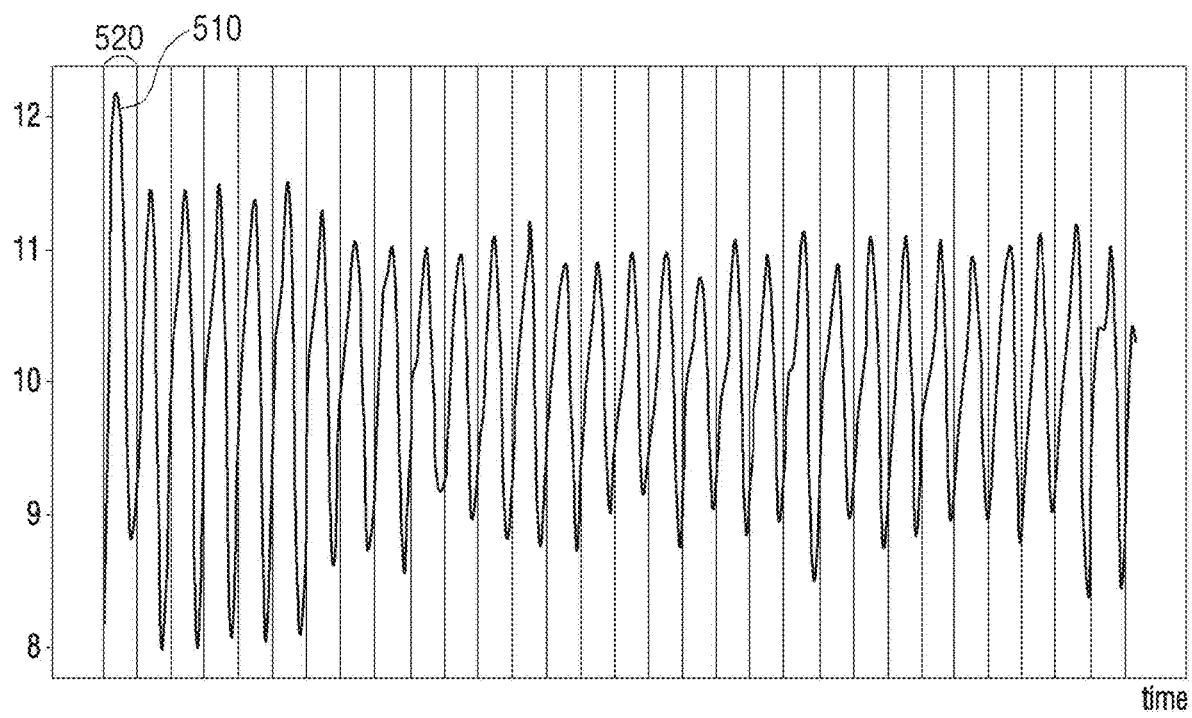
FIG. 5A is a diagram illustrating periodicity of acceleration data and a result of step detection according to an embodiment of the disclosure.

FIG. 5A is a diagram illustrating periodicity of acceleration data generated during walking and a result of step detection according to an embodiment of the disclosure.

FIG. 5B is a diagram for illustrating accuracy of a result of step detection according to an embodiment of the disclosure.

Figure 6A:
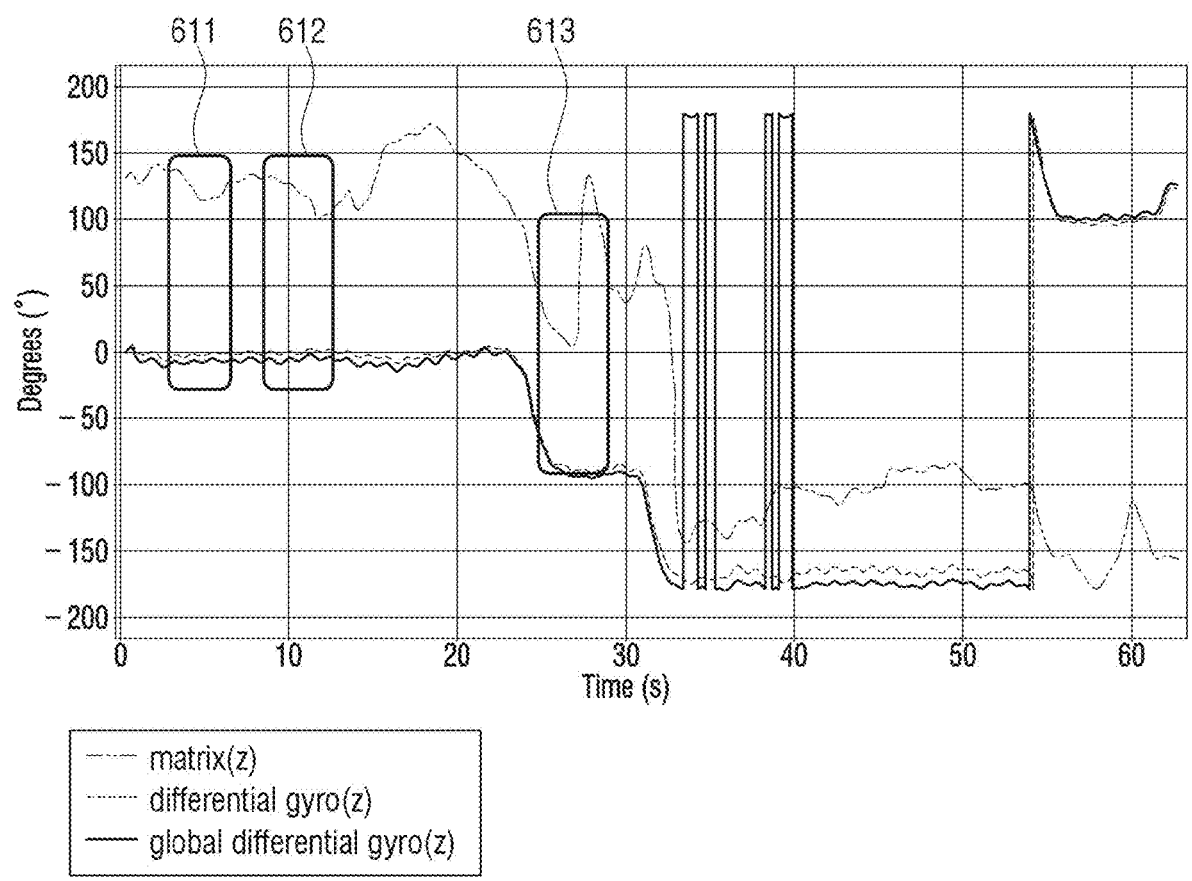
FIG. 6A is a diagram for illustrating a method of correcting a gyro sensor according to an embodiment of the disclosure.

FIG. 6A is a diagram for illustrating a method of correcting a gyro sensor according to an embodiment of the disclosure.

Figure 6B:
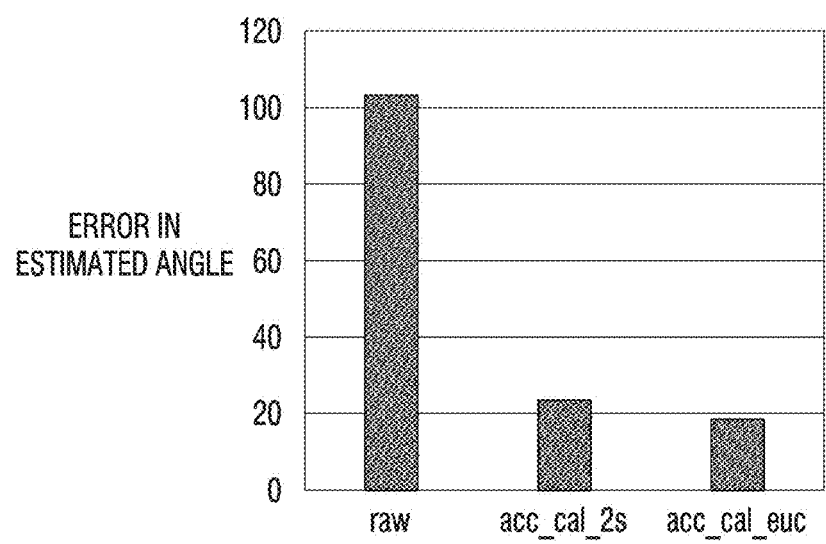
FIG. 6B is a diagram for illustrating a method of correcting a gyro sensor according to an embodiment of the disclosure.

FIG. 6B is a diagram for illustrating a method of correcting a gyro sensor according to an embodiment of the disclosure.

The processor 140 may compare gyro data of the gyro sensor 120 and geomagnetic data of the geomagnetic sensor 130, and correct the gyro data based on the result of comparison. This is because the gyro sensor 120 can track only a relative change in the posture in the previous state, and thus it may be necessary to correct the gyro data periodically as absolute data of the geomagnetic sensor 130. However, the data of the geomagnetic sensor 130 may be influenced by a deviated magnetic field. Accordingly, in case a difference between geomagnetic data and gyro data belongs to a predetermined range, the gyro data may be corrected based on the geomagnetic data.

The gyro sensor 120 shows a state wherein a small amount of errors are accumulated, and the geomagnetic sensor 130 shows a state wherein a big error occurs according to geomagnetic deviation of a subject space. Accordingly, the processor 140 may use data of the gyro sensor 120 in general, and for every moment when it is determined that there is no geomagnetic deviation, may correct the data of the gyro sensor 120 based on the data of the geomagnetic sensor 130.

Referring to FIG. 6A, the processor 140 may compare a difference between a moving direction (e.g., a differential gyro(z)) that is estimated by the gyro sensor 120 for a specific time period (e.g., two seconds) and a moving direction (e.g., matrix(z)) that estimated by the geomagnetic sensor 130 as a Euclidean distance, and perform correction only when they are similar as illustrated by reference numerals 611, 612, 613. As illustrated in FIG. 6B, as a result of performing correction by the aforementioned method in case a difference between a moving angle of a user and a moving angle of a smartphone is 90°, the original error (raw) was improved greatly. Also, better accuracy of correction was shown in the case of correcting based on a degree of similarity in a Euclidean distance (acc_cal_euc) than in the case of simply correcting once every two seconds (acc_cal_2 s) as a comparative group.

Figure 7A:
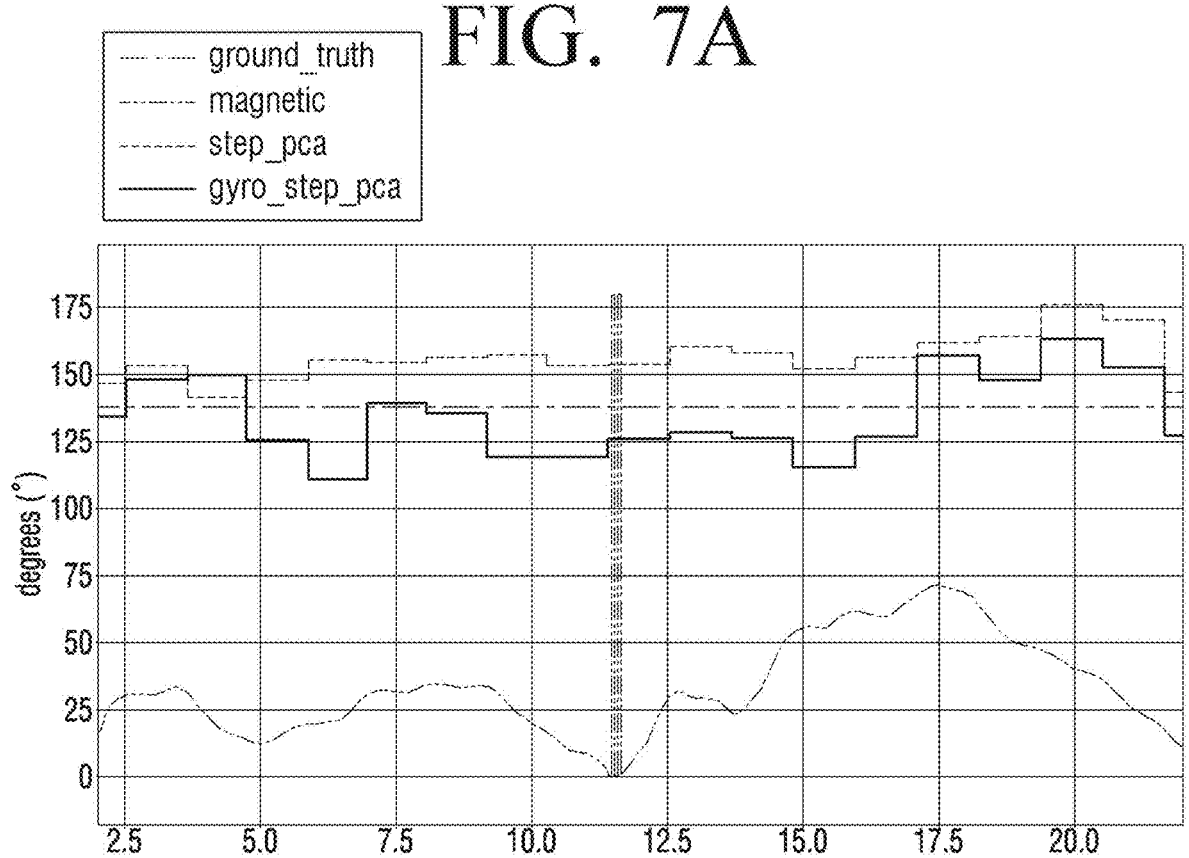
FIG. 7A is a diagram for illustrating an effect of correcting a gyro sensor according to an embodiment of the disclosure.
Figure 7B:
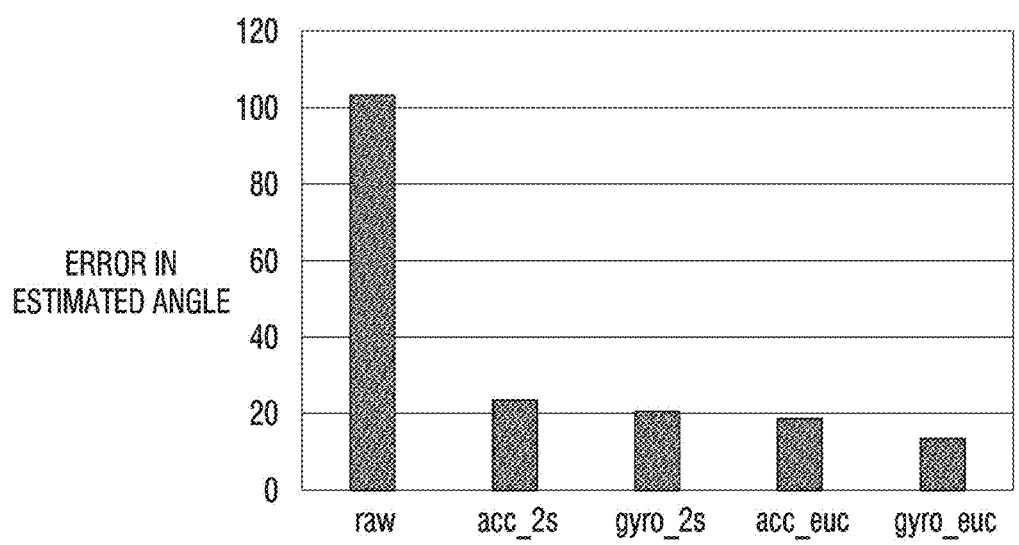
FIG. 7B is a diagram for illustrating an effect of correcting a gyro sensor according to an embodiment of the disclosure.

FIGS. 7A and 7B are diagrams for illustrating an effect of correcting a gyro sensor according to various embodiments of the disclosure.

Referring to FIG. 7A shows data in case a user walks in a space where geomagnetic deviation exists while possessing an electronic apparatus 100 such that the angle between the moving direction of the user and the direction pointed by the electronic apparatus 100 is 90°.

In the moving direction (FIG. 7A-matrix, FIG. 7B-raw) estimated by the geomagnetic sensor 130, both of an error due to the form of possession and an error due to geomagnetic pollution exist. Accordingly, a big error occurs in the actual moving direction (ground truth). However, an error according to the form of possession was greatly improved both in the case of applying PCA based on the gyro sensor 120 (gyro_step_pca) and in the case of applying PCA based on the acceleration sensor 110 (step_pca) according to an embodiment of the disclosure.

In the case of an error due to geomagnetic deviation in an indoor space, compared to acc_2 s (accelerometer PCA) and gyro_2 s (gyro PCA) which are the result of simply fusing the gyro sensor 120 and the geomagnetic sensor 130 every two seconds, acc_euc (accelerometer PCA) and gyro_euc (gyro PCA) which are the result of fusion based on an Euclidean distance showed a better correction performance in FIG. 7B.

Figure 8A:
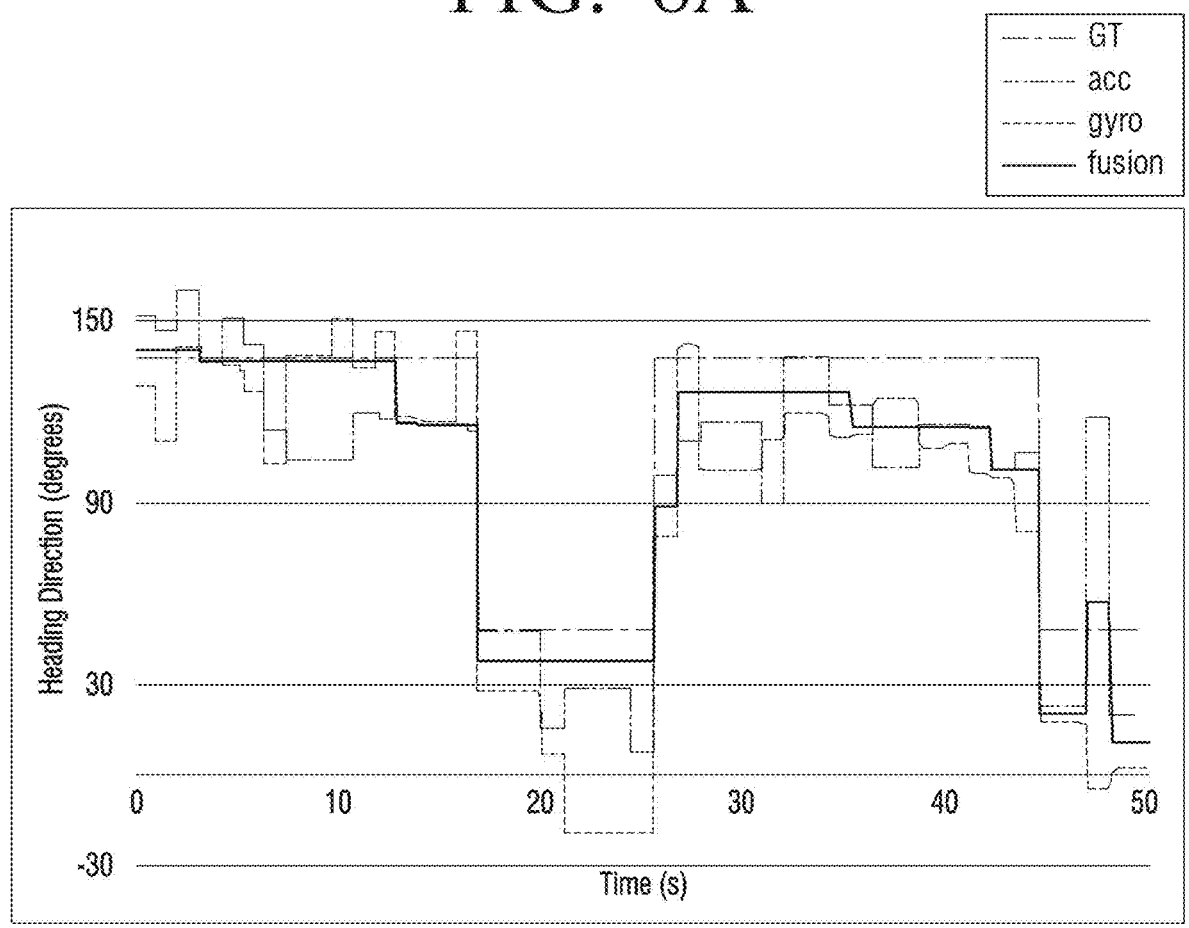
FIG. 8A is a diagram illustrating a principal component analysis (PCA) according to an embodiment of the disclosure.
Figure 8B:
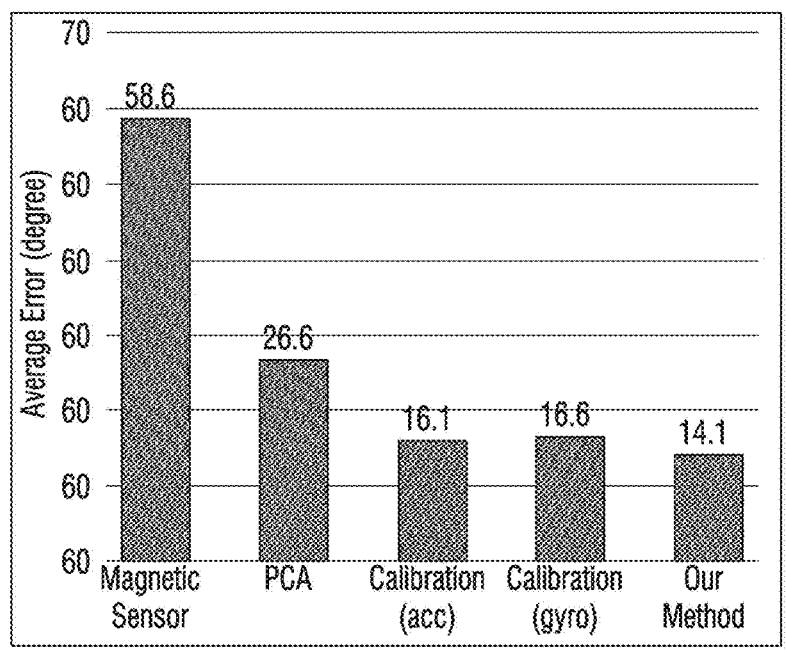
FIG. 8B is a diagram illustrating a PCA according to an embodiment of the disclosure.
Figure 8B:
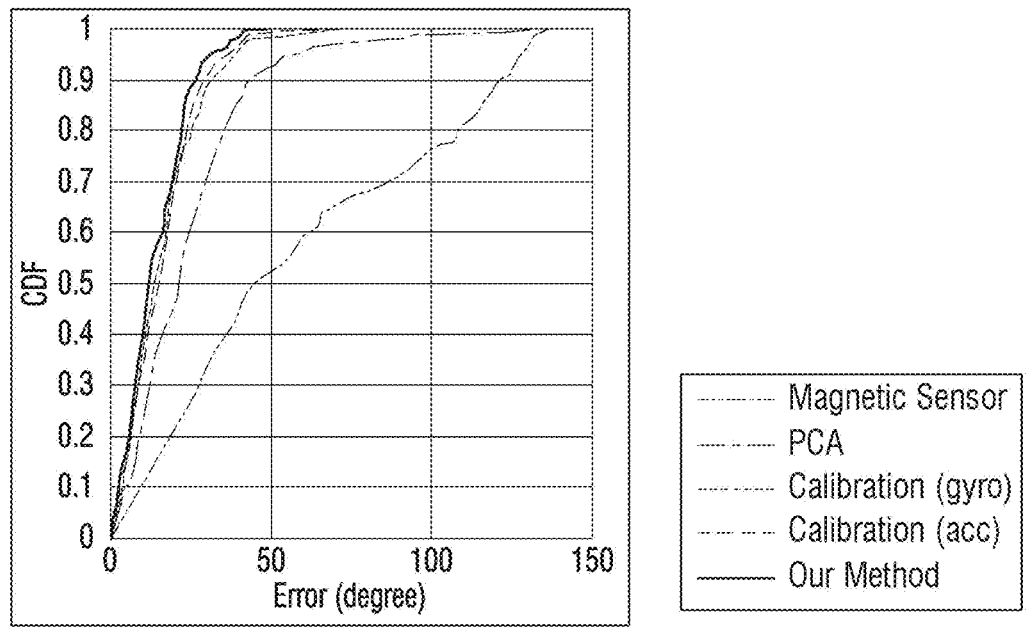

FIGS. 8A and 8B are diagrams illustrating a PCA according to various embodiments of the disclosure.

The acceleration sensor 110 and the gyro sensor 120 separately estimate a moving direction of a user by respectively detecting acceleration in a to-and-fro direction and rotation of arms and legs independently. This is because the states of errors generated may differ, even if the sensors separately estimate the actual moving direction of the user. Accordingly, in the disclosure, a moving direction of a user may be estimated basically by using an average value of PCA values based on the two sensors.

For example, as illustrated in FIG. 8A, it can be figured out that a moving direction according to a mean value (fusion) of a PCA value of data acquired by the acceleration sensor 110 (acc) and a PCA value of data acquired by the gyro sensor 120 (gyro) is similar to the actual moving direction of a user (GT).

Referring to FIG. 8B, it can be figured out that, compared to an error according to a value of a geomagnetic sensor (Magnetic Sensor) and an error according to a PCA value acquired by a PCA, an error according to a PCA value acquired by the acceleration sensor 110 (Calibration(acc)), an error according to a PCA value acquired by the gyro sensor 120 (Calibration(gyro)), and an error according to fusion of a PCA value acquired by the acceleration sensor 110 and a PCA value acquired by the gyro sensor 120 (our method) according to the various embodiments of the disclosure are much smaller.

Figure 9:
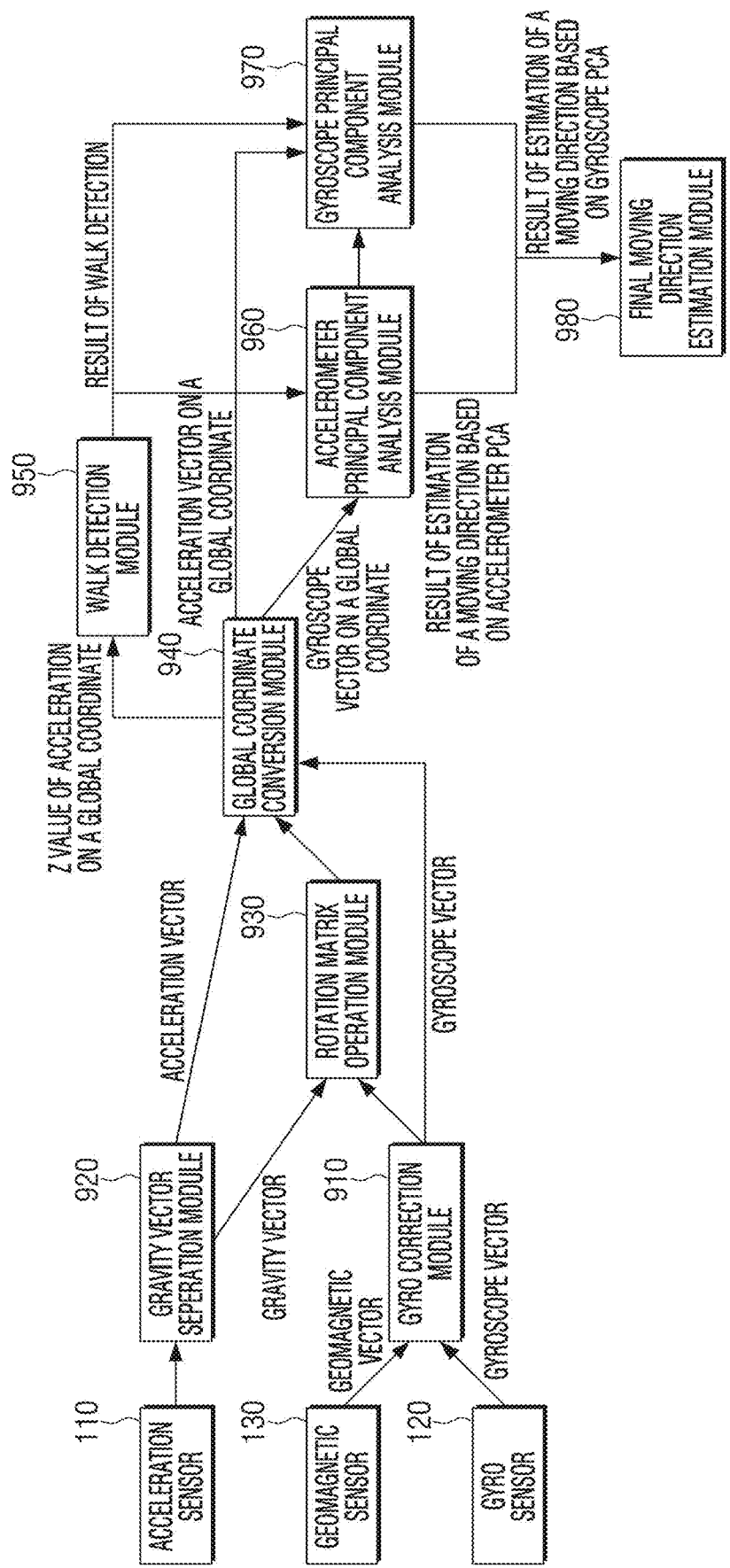
FIG. 9 is a diagram for illustrating a method of estimating a moving direction of a user according to an embodiment of the disclosure.

FIG. 9 is a diagram for illustrating a method of estimating a moving direction of a user according to an embodiment of the disclosure.

A gyro correction module 910 may correct data of the gyro sensor 120 based on the output data of the gyro sensor 120, for example, a gyroscope vector, and the output data of the geomagnetic sensor 130, for example, a geomagnetic vector.

As the gyro sensor 120 can track only a relative change in the posture in the previous state, the result of the gyro sensor 120 may be initiated with the data of the geomagnetic sensor 130 at first. However, the drift errors of the gyro sensor 120 accumulate as time passes, and thus periodic correction may be needed. According to an embodiment of the disclosure, an attitude of the electronic apparatus 100 may be tracked by converting a local coordinate system (LCS) to a GCS.

A rotation quaternion indicating a current posture of the electronic apparatus 100 may be expressed as q. First, a predicted posture is set as an initial posture by using the output of the acceleration sensor 110 and the geomagnetic sensor 130, and a rotation at the next moment is integrated with the previous posture. In this case, a quaternion qi indicating the current posture with respect to each integral section i may be calculated as in the following Equation 1.

$$qi = \triangle qi-1 = \exp(\omega \triangle t/2) qi-1 \qquad \text{Equation 1}$$

Here, $\triangle qi$ is a quaternion indicating a rotation in a predetermined section, $\omega$ is average angular velocity, and $\triangle t$ is the length of a predetermined section.

Errors in posture estimation by the gyro sensor 120 accumulate as time passes, and thus the posture of the electronic apparatus 100 may be corrected whenever possible. That is, posture estimation using the geomagnetic sensor 130 (e.g., a compass) and the acceleration sensor 110 is independent from previous estimation and there is no accumulation of errors. However, output of the geomagnetic sensor 130 is not accurate in an indoor environment, and thus postures may be unstable. Accordingly, by comparing a yaw pattern estimated by the geomagnetic sensor 130 and the acceleration sensor 110 with a yaw pattern acquired at the gyro sensor 120, accuracy of posture estimation based on the geomagnetic sensor 130 and the acceleration sensor 110 may be identified.

Yawg={yg1, yg2, ..., ygn} indicates a yaw pattern using a gyroscope, and ={yc1, yc2, ..., ycn} indicates a yaw pattern using a compass and an accelerometer. In this case, similarity of a yaw pattern may be quantified by using a zero average Euclidean distance. A Euclidian distance is a method generally used in calculating a distance between two points, and it may be expressed as in the following Equation 2.

$$d(\text{Yaw}_g, \text{Yaw}_c) = (\Sigma((y_{gi} - \mu_g) - (y_{ci} - \mu_c)))^{1/2} \qquad \text{Equation 2}$$

Here, $\mu_g$ and $\mu_c$ are averages values of each of $\text{Yaw}_g$ and $\text{Yaw}_c$.

In case yaw patterns are similar, i.e., if a distance between two yaw patterns is smaller than a threshold, a current posture may be corrected by the results of the geomagnetic sensor 130 and the acceleration sensor 110.

A gravity vector separation module 920 may separate a gravity vector from the data of the acceleration sensor 110, and provide it to a rotation matrix operation module 930.

The rotation matrix operation module 930 operates a rotation matrix by using a gravity vector and a gyroscope vector.

The rotation matrix operation module 930 may convert a coordinate of a vector to a GCS by rotating a gravity vector, i.e., a LCS gravity vector by using a current rotation quaternion q. Then, the rotation matrix operation module 930 may calculate a rotation matrix $R_{grav}$ that aligns a GCS gravity vector $v_{grav}$ with an actual gravity vector, i.e., [0 0 1]. If v is assumed as a cross multiplication vector of $v_{grav}$ and [0 0 1], a rotation matrix may be calculated as in the following Equation 3.

$$R_{grav} = \cos(\theta)I + \sin(\theta)[v]x + (1-\cos(\theta))vv^t \qquad \text{Equation 3}$$

Here, $\theta$ is an angle between two vectors, I is an identity matrix, and $[v]x$ is a skew-symmetric matrix of v. Also, superscript $^t$ is a transpose operation.

A global coordinate conversion module 940 converts an acceleration vector and a gyroscope vector to an acceleration vector on a global coordinate and a gyroscope vector on a global coordinate based on a rotation matrix calculated by the rotation matrix operation module 930. This is because a gyroscope vector can track a relative change in the posture in the previous state, and thus it is necessary to track the absolute posture of the electronic apparatus 100 in a global coordinate system (GCS). In this case, the coordinate system of the electronic apparatus 100 may be called as a local coordinate system (LCS).

Coordinate conversion from a vector of a LCS, $v_{LCS}$, to a vector of a GCS, $v_{GCS}$ may be expressed as in the following Equation 4.

$$p_{GCS} = q\, p_{LCS}\, q^{-1} \qquad \text{Equation 4}$$

Here, $p_{GCS}$ s and $p_{LCS}$ are imaginary parts, and are pure quaternions having $v_{GCS}$ and $v_{LCS}$, i.e., [0 $v_{GCS}$] and [0 $v_{LCS}$]. Meanwhile, superscript $^{-1}$ indicates an inverse operation.

The global coordinate conversion module 940 may provide an acceleration vector on a global coordinate to an acceleration principal component analysis module 960, and provide a gyroscope vector on a global coordinate to a gyroscope principal component analysis module 970.

A walk detection module 950 may detect a walk based on a Z value of an acceleration vector on a global coordinate, and provide the result of walk detection to the acceleration principal component analysis module 960 and the gyroscope principal component analysis module 970.

The acceleration principal component analysis module 960 acquires a result of estimating a moving direction based on accelerometer PCA based on an acceleration vector on a global coordinate and a result of walk detection.

The gyroscope principal component analysis module 970 acquires a result of estimating a moving direction based on gyroscope PCA based on a gyroscope vector on a global coordinate and a result of walk detection.

The acceleration principal component analysis module 960 and the gyroscope principal component analysis module 970 apply PCA to the result of each sensor within a predetermined time window. The size of the window of sampling data for performing PCA may influence accuracy of estimation of a heading direction, as the direction and the walking speed of a user change as time passes. Accordingly, by detecting a walk of a user, the size of the window may be adaptively changed. First, an average value of raw data is acquired, and smoothing processing is performed on sensor data. Next, a walk may be detected by using an algorithm that identifies a walk based on a walking pattern of a user (A. Rai, K. Chintalapudi, V. Padmanabhan, and R. Sen, "Zee: Zero-effort crowdsourcing for indoor localization," Proceedings of the 18th annual international conference on Mobile computing and networking, Association for Computing Machinery, 2012.) Then, the size of the window may be set by using the detected walk, and lastly, PCA may be applied to data sampled at the window. That is, the acceleration principal component analysis module 960 and the gyroscope principal component analysis module 970 may sample each of an acceleration vector on a global coordinate and a gyroscope vector on a global coordinate.

A final moving direction estimation module 980 estimates a final moving direction based on a result of estimating a moving direction based on accelerometer PCA and a result of estimating a moving direction based on gyroscope PCA. In this case, the final moving direction estimation module 980 may compare/supplement a result of estimating a moving direction based on accelerometer PCA and a result of estimating a moving direction based on gyroscope PCA with respect to each other, and filter an unstable result, and thereby estimate a final moving direction.

If a user possesses the electronic apparatus 100 in a static posture while walking, the body of the user moves a little bit in a to-and-fro direction, and thus the sampled acceleration data may be aligned with the heading direction. Thus, a PCA result using an accelerometer may be identical to the heading direction. However, in a PCA result using a gyroscope, angular velocity of the electronic apparatus 100 is close to 0, and thus the result may be inaccurate. In contrast, when a user possesses the electronic apparatus 100 in a dynamic posture (a swing case and a pocket case), both of a PCA result using the acceleration sensor 110 and a PCA result using the gyro sensor 120 may be accurate. For example, if a user holds a smartphone in one hand, acceleration data may be aligned with the heading direction, and gyroscope data may be aligned with the user's shoulder constituting a right angle with the heading direction.

Accordingly, two estimated heading directions respectively calculated by a gyroscope and an accelerometer may be fused. Theoretically, two kinds of PCA results using a gyroscope and an accelerometer should be a right angle, and thus estimation of a heading direction should be a right angle. However, there may be slight discrepancy in the estimation values. Accordingly, only in case where a difference is smaller than a specific threshold, an average value of two kinds of estimation is used as a heading direction, but in other cases, the heading direction of the previous interval may be used again.

FIG. 10 is a flow chart for illustrating a control method of an electronic apparatus according to an embodiment of the disclosure.

According to the control method of an electronic apparatus illustrated in FIG. 10, first, geomagnetic data of a geomagnetic sensor and gyro data of a gyro sensor are compared, and gyro data is corrected at operation S1010. Then, a first value is acquired by applying PCA to acceleration data of the acceleration sensor, and a second value is acquired by using PCA to gyro data at operation S1020. Then, a moving direction of a user of the electronic apparatus is estimated based on the first value and the second value at operation S1030.

Also, at operation S1010 wherein gyro data is corrected, if a difference between geomagnetic data and gyro data is smaller than a threshold, gyro data may be corrected based on the geomagnetic data.

In addition, at operation S1030 wherein a moving direction of a user is estimated, a first value and a second value may be acquired in predetermined section units, and a moving direction of a user of the electronic apparatus may be estimated based on an average value of the first value and the second value in each section.

Further, at operation S1030 wherein a moving direction of a user is estimated, if a difference between a first value and a second value exceeds a predetermined range in a specific section, a moving direction of a user of the electronic apparatus may be estimated by using an average value acquired in the previous section.

Here, the section units may be units including at least a single step. In this case, at operation S1030 wherein a moving direction of a user is estimated, a step may be identified based on a Z axis value acquired from the acceleration sensor.

Also, at operation S1020 wherein a first value and a second value are acquired, an acceleration vector acquired from the acceleration sensor may be converted to an acceleration vector on a global coordinate, and a gyroscope vector acquired from the gyro sensor may be converted to a gyroscope vector on a global coordinate, and the first value and the second value may be acquired by applying the PCA to each of the converted acceleration vector on a global coordinate and the converted gyroscope vector on a global coordinate.

In addition, at operation S1020 wherein a first value and a second value are acquired, a rotation matrix may be calculated based on a geomagnetic vector acquired from the geomagnetic sensor, an acceleration vector acquired from the acceleration sensor, and a gyroscope vector, and the acceleration vector and the gyroscope vector may be converted to the acceleration vector on a global coordinate and the gyroscope vector on a global coordinate based on the calculated rotation matrix.

Further, at operation S1020 wherein a first value and a second value are acquired, a current posture of the electronic apparatus may be identified based on the geomagnetic data and the acceleration data, and the rotation matrix may be calculated based on the current posture.

Also, at operation S1020 wherein a first value and a second value are acquired, the reliability of the current posture of the electronic apparatus may be identified based on whether an Euclidean distance between a yaw pattern acquired based on the geomagnetic data and the acceleration data and a yaw pattern acquired based on the gyro data is smaller than a threshold.

According to the various embodiments of the disclosure as described above, errors that may occur in estimating a heading direction of a user can be reduced as much as possible.

Meanwhile, the methods according to the various embodiments of the disclosure as described above may be implemented in the form of applications that can be installed on electronic apparatuses.

Also, the methods according to the various embodiments of the disclosure as described above may be implemented only with software upgrade, or hardware upgrade of electronic apparatuses.

In addition, the various embodiments of the disclosure as described above may be performed through an embedded server provided on an electronic apparatus, or an external server of at least one of an electronic apparatus or a display apparatus.

Meanwhile, according to an embodiment of the disclosure, the various embodiments of the disclosure as described above may be implemented as software including instructions stored in machine-readable storage media, which can be read by machines (e.g.: computers). The machines refer to apparatuses that call instructions stored in a storage medium, and can operate according to the called instructions, and the apparatuses may include an electronic apparatus according to the aforementioned embodiments (e.g. an electronic apparatus A). In case an instruction is executed by a processor, the processor may perform a function corresponding to the instruction by itself, or by using other components under its control. An instruction may include a code that is generated or executed by a compiler or an interpreter. A storage medium that is readable by machines may be provided in the form of a non-transitory storage medium. Here, the term 'non-transitory' only means that a storage medium does not include signals, and is tangible, but does not indicate whether data is stored in the storage medium semi-permanently or temporarily.

Further, each of the components according to the aforementioned various embodiments (e.g. a module or a program) may consist of a singular object or a plurality of objects. Also, among the aforementioned corresponding sub components, some sub components may be omitted, or other sub components may be further included in the various embodiments. Generally or additionally, some components (e.g. module or a program) may be integrated as an object, and perform the functions that were performed by each of the components before integration identically or in a similar manner. A module, a program, or operations performed by other components according to the various embodiments may be executed sequentially, in parallel, repetitively, or heuristically. Or, at least some of the operations may be executed or omitted in a different order, or other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic apparatus comprising:
   an acceleration sensor configured to sense acceleration data based on a movement of user of the electronic apparatus;
   a geomagnetic sensor configured to sense geomagnetic data;
   a gyro sensor configured to sense gyro data; and
   a processor configured to:
      obtain a first rotation angle according to rotation state of at least one of x, y, and z axes based on the geomagnetic data of the geomagnetic sensor, for tracking a relative change in a posture of the user in a previous state,
      obtain a second rotation angle according to rotation state of at least one of x, y, and z axes based on the gyro data of the gyro sensor, for obtaining an absolute data,
      obtain a difference between the first rotation angle and the second rotation angle,
      when the difference between the first rotation angle and the second rotation angle is smaller than a threshold, correct the gyro data periodically based on the geomagnetic data of a time point which the geomagnetic data is not deviated, for reducing an error of the gyro sensor,
      obtain a first value based on a principal component analysis (PCA) of the acceleration data of the acceleration sensor,
      obtain a second value based on a PCA of the corrected gyro data, and
      estimate a moving direction the user based on an average value of the first value and the second value,
   wherein the processor is further configured to:
      obtain the first value and the second value in predetermined section units, wherein the section units comprise at least one step of the user,
      identify the section units based on a Z axis value included in the acceleration data, and
      estimate the moving direction based on the average value of the first value and the second value in each section unit.

2. The electronic apparatus of claim 1, wherein the processor is further configured to, when the difference between the first value and the second value exceeds a predetermined range in a specific section, estimate the moving direction of the electronic apparatus based on the average value acquired in a previous section.

3. The electronic apparatus of claim 1, wherein the processor is further configured to:
   convert a first acceleration vector included in the acceleration data to a second acceleration vector of a global coordinate system, and convert a first gyroscope vector included in the corrected gyro data to a second gyroscope vector of the global coordinate system, wherein the first value and the second value are obtained based on applying the PCA to the second acceleration vector and the second gyroscope vector.

4. The electronic apparatus of claim 3, wherein the processor is further configured to:

calculate a rotation matrix based on a geomagnetic vector included in the geomagnetic data, a third acceleration vector included in the acceleration data, and a third gyroscope vector included in the corrected gyro data, convert the third acceleration vector to a fourth acceleration vector of the global coordinate system based on the rotation matrix, and convert the third gyroscope vector to a fourth gyroscope vector of the global coordinate system based on the rotation matrix.

5. The electronic apparatus of claim 4, wherein the processor is further configured to: identify a current posture of the electronic apparatus based on the geomagnetic data and the acceleration data, and wherein the rotation matrix is further calculated based on the current posture.

6. The electronic apparatus of claim 5, wherein the processor is further configured to:

acquire a first yaw pattern based on the geomagnetic data and the acceleration data, acquire a second yaw pattern based on the corrected gyro data, and identify a reliability of the current posture based on whether a Euclidean distance between the first yaw pattern and the second yaw pattern is smaller than a threshold.

7. A method of an electronic apparatus including an acceleration sensor, a geomagnetic sensor and a gyro sensor comprising:

obtaining an acceleration data based on a movement of user of the electronic apparatus;

obtaining a first rotation angle according to rotation state of at least one of x, y, and z axes based on geomagnetic data of the geomagnetic sensor, for tracking a relative change in a posture of the user in a previous state;

obtaining a second rotation angle according to rotation state of at least one of x, y, and z axes based on gyro data of the gyro sensor, for obtaining an absolute data;

obtaining a difference between the first rotation angle and the second rotation angle;

when the difference between the first rotation angle and the second rotation angle is smaller than a threshold, correcting the gyro data periodically based on the geomagnetic data of a time point which the geomagnetic data is not deviated, for reducing an error of the gyro sensor;

obtaining a first value based on a principal component analysis (PCA) of the acceleration data of the acceleration sensor;

obtaining a second value based on a PCA of the corrected gyro data; and estimating a moving direction of the user based on an average value of the first value and the second value, wherein the method further comprising:

obtaining the first value and the second value in predetermined section units, wherein the section units comprise at least one step of the user, identifying the section units based on a Z axis value included in the acceleration data, and estimating the moving direction based on the average value of the first value and the second value in each section unit.

8. The method of claim 7, wherein the estimating of the moving direction comprises, when the difference between the first value and the second value exceeds a predetermined range in a specific section, estimating the moving direction based on the average value acquired in a previous section.

9. The method of claim 7, further comprising:

converting a first acceleration vector included in the acceleration data to a second acceleration vector of a global coordinate system; and converting a first gyroscope vector included in the corrected gyro data to a second gyroscope vector of the global coordinate system, wherein the first value and the second value are obtained based on applying the PCA to the second acceleration vector and the second gyroscope vector.

10. The method of claim 9, further comprising:

calculating a rotation matrix based on a geomagnetic vector included in the geomagnetic data, a third acceleration vector included in the acceleration data, and a third gyroscope vector included in the corrected gyro data converting the third acceleration vector to a fourth acceleration vector of the global coordinate system based on the rotation matrix; and converting the third gyroscope vector to a fourth gyroscope vector of the global coordinate system based on the rotation matrix.

11. The method of claim 10, further comprising identifying a current posture of the electronic apparatus based on the geomagnetic data and the acceleration data, wherein the rotation matrix is further calculated based on the current posture.

12. The method of claim 11, further comprising:

acquiring a first yaw pattern based on the geomagnetic data and the acceleration data;

acquiring a second yaw pattern based on the corrected gyro data; and identifying a reliability of the current posture based on whether a Euclidean distance between the first yaw pattern and the second yaw pattern is smaller than a threshold.

13. A non-transitory computer-readable medium storing computer instructions for making an electronic apparatus perform operations executed by a processor of the electronic apparatus including an acceleration sensor, a geomagnetic sensor and a gyro sensor, wherein the operations comprise:

obtaining an acceleration data based on a movement of user of the electronic apparatus;

obtaining a first rotation angle according to rotation state of at least one of x, y, and z axes based on geomagnetic data of the geomagnetic sensor, for tracking a relative change in a posture of the user in a previous state;

obtaining a second rotation angle according to rotation state of at least one of x, y, and z axes based on gyro data of the gyro sensor, for obtaining an absolute data;

obtaining a difference between the first rotation angle and the second rotation angle;

when the difference between the first rotation angle and the second rotation angle is smaller than a threshold, correcting the gyro data periodically based on the geomagnetic data of a time point which the geomagnetic data is not deviated, for reducing an error of the gyro sensor;

obtaining a first value based on a principal component analysis (PCA) of the acceleration data of the acceleration sensor;

obtaining a second value based on a PCA of the corrected gyro data; and estimating a moving direction of the user based on an average value of the first value and the second value, wherein the operations further comprise:

obtaining the first value and the second value in predetermined section units, wherein the section units comprise at least one step of the user, identifying the section units based on a Z axis value included in the acceleration data, and estimating the moving direction based on the average value of the first value and the second value in each section unit.

* * * * *